United States Patent
Koo et al.

(10) Patent No.: US 10,622,490 B2
(45) Date of Patent: Apr. 14, 2020

(54) RECONFIGURABLE LOGIC DEVICE USING ELECTROCHEMICAL POTENTIAL

(71) Applicant: KOREA INSTITUTE OF SCIENCE AND TECHNOLOGY, Seoul (KR)

(72) Inventors: Hyun Cheol Koo, Seoul (KR); Hyung Jun Kim, Seoul (KR); Cha Un Jang, Seoul (KR); Joon Yeon Chang, Seoul (KR); Suk Hee Han, Seoul (KR); Joo Hyeon Lee, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 22 days.

(21) Appl. No.: 15/920,493

(22) Filed: Mar. 14, 2018

(65) Prior Publication Data
US 2019/0035943 A1   Jan. 31, 2019

(30) Foreign Application Priority Data

Jul. 27, 2017 (KR) .......................... 10-2017-0095635

(51) Int. Cl.
*H01L 29/82* (2006.01)
*H01L 29/12* (2006.01)
(Continued)

(52) U.S. Cl.
CPC .............. *H01L 29/82* (2013.01); *B82Y 10/00* (2013.01); *H01L 27/08* (2013.01); *H01L 29/122* (2013.01); *H01L 29/205* (2013.01); *H01L 29/43* (2013.01); *H01L 29/66977* (2013.01); *H01L 29/66984* (2013.01); *H03K 19/08* (2013.01); *H03K 19/18* (2013.01); *H03K 19/20* (2013.01); *H01L 29/423* (2013.01)

(58) Field of Classification Search
None
See application file for complete search history.

(56) References Cited

U.S. PATENT DOCUMENTS

2013/0140606 A1* 6/2013 Koo .................. H01L 29/66984
257/195

FOREIGN PATENT DOCUMENTS

EP  1 608 071 A1   12/2005
EP  1608071 A1 * 12/2005 ....... H01L 29/66984
(Continued)

OTHER PUBLICATIONS

Korean Office Action dated Sep. 13, 2018.
(Continued)

*Primary Examiner* — Steven B Gauthier
(74) *Attorney, Agent, or Firm* — Rabin & Berdo, P.C.

(57) ABSTRACT

Provided is a reconfigurable logic device using an electrochemical potential. The device includes first and second semiconductor channels, where an effective magnetic field direction of a channel is controlled by a current direction and which are spaced apart from each other, a first ferromagnetic gate contacting the first semiconductor channel and a second ferromagnetic gate contacting the second semiconductor channel, where a magnetization direction is controlled by a gate voltage, and a control unit configured to calculate a difference value corresponding to a difference between a first determination value and a second determination value, and compare the difference value with a reference value to determine an output value.

7 Claims, 3 Drawing Sheets

(51) Int. Cl.
  *H03K 19/18* (2006.01)
  *B82Y 10/00* (2011.01)
  *H01L 29/66* (2006.01)
  *H01L 27/08* (2006.01)
  *H01L 29/205* (2006.01)
  *H01L 29/43* (2006.01)
  *H03K 19/08* (2006.01)
  *H03K 19/20* (2006.01)
  *H01L 29/423* (2006.01)

(56) References Cited

FOREIGN PATENT DOCUMENTS

| KR | 10-2009-0089028 A | 8/2009 |
| KR | 10-2010-0037683 A | 4/2010 |

OTHER PUBLICATIONS

Masaaki Tanaka et al., "MOS-Based Spin Devices for Reconfigurable Logic", IEEE Transactions on Electron Devices, May 2007, pp. 961-976, vol. 54, No. 5.

S. G. Tan et al., "Utilization of magnetoelectric potential in ballistic nanodevices", Journal of Applied Physics, 2006, pp. 084305-1~084305-6, vol. 99.

Yoji Kunihashi et al., "Proposal of spin complementary field effect transistor", Applied Physics Letter, 2012, pp. 113502-1~113502-3, vol. 100.

S Bala Kumar et al., "High and tunable spin current induced by magnetic-electric fields in a single-mode spintronic device", Nanotechnology, 2009, pp. 365204, vol. 20.

Anonymous, "Rashba gets hotter and more pronounced", physicsworld, Aug. 17, 2011, pp. 1-3.

European Search Report dated Nov. 15, 2018.

* cited by examiner

RECONFIGURABLE LOGIC DEVICE USING ELECTROCHEMICAL POTENTIAL

CROSS-REFERENCE TO RELATED APPLICATION

This application claims priority to Korean Patent Application No. 10-2017-0095635 filed on Jul. 27, 2017 and all the benefits accruing therefrom under 35 U.S.C. § 119, the contents of which are incorporated by reference in their entirety.

BACKGROUND

The present disclosure relates to an electronic element, and more particularly to a reconfigurable logic device.

Semiconductor-based logic devices are the most important and high value-added field in integrated circuits that perform and process complex functions, and research groups and companies are conducting research thereon. The logic devices are a core field for carrying out various operations, and are a key field that leads the semiconductor market together with the memory elements.

On the other hand, in the recent logic device, since the silicon electronic element technology approaches the physical limit, it is difficult to reduce the size of the element and the nano-sized element process is consuming a lot of cost. As a result, the emergence of next generation electronic elements becomes necessary. For example, research has been conducted on electronic elements using the concept of using spin, which is a quantum mechanical property of electrons, rather than simply improving or miniaturizing existing elements.

SUMMARY

The present disclosure provides a logic device capable of fundamentally overcoming the physical limitations of silicon electronic element technology, and for example, provides a reconfigurable logic device using an electrochemical potential.

In accordance with an embodiment, a reconfigurable logic device using an electrochemical potential includes: a first semiconductor channel and a second semiconductor channel, where an effective magnetic field direction of a channel is controlled by a current direction and which are spaced apart from each other; a first ferromagnetic gate contacting the first semiconductor channel and a second ferromagnetic gate contacting the second semiconductor channel, where a magnetization direction is controlled by a gate voltage; and a control unit configured to calculating a difference value corresponding to a difference between a first determination value determined with each different value according to whether the effective magnetic field direction of the first semiconductor channel is equal to the magnetization direction of the first ferromagnetic gate and a second determination value determined with each different value according to whether the effective magnetic field direction of the second semiconductor channel is equal to the magnetization direction of the second ferromagnetic gate, and compare the difference value with a reference value to determine an output value.

The semiconductor channel may include a quantum well layer and a cladding layer disposed asymmetrically above and below the quantum well layer, or includes a topological insulator or a two-dimensional material layer, wherein the Rashba effect may convert an electric field into a magnetic field.

The quantum well layer may include at least one layer of an InAs layer, an InGaAs layer, an InSb layer, and a GaAs layer and the cladding layer may include at least one or more layers of an InGaAs layer, an InAlAs layer, an InAlSb layer, an AlGaSb layer and an AlGaAs layer.

The ferromagnetic gate may include an upper magnetic layer, a lower magnetic layer, and an insulating layer interposed between the upper magnetic layer and the lower magnetic layer, wherein the magnetization direction of the upper magnetic layer may be fixed but the magnetization direction of the lower magnetic layer may be controlled by the applied gate voltage such that the magnetization direction of the lower magnetic layer determines a logic function, wherein the lower magnetic layer may be disposed to contact the semiconductor channel.

The reconfigurable logic device may provide an OR logic configuration, wherein when the current direction is a first direction in the semiconductor channel, the effective magnetic field direction of the channel is a second direction, and when the current direction is a third direction opposite the first direction, the effective magnetic field direction of the channel is configured to have a fourth direction opposite the second direction, wherein a first gate voltage is applied to the first ferromagnetic gate such that the magnetization direction of the lower magnetic layer of the first ferromagnetic gate is parallel to the fourth direction, and a second gate voltage is applied to the second ferromagnetic gate such that the magnetization direction of the lower magnetic layer of the second ferromagnetic gate is parallel to the second direction, wherein when the effective magnetic field direction of the first semiconductor channel is equal to the magnetization direction of the lower magnetic layer of the first ferromagnetic gate, the first determination value is $+\Delta V$ and if not, the first determination value is $-\Delta V$, wherein when the effective magnetic field direction of the second semiconductor channel is equal to the magnetization direction of the lower magnetic layer of the second ferromagnetic gate, the second determination value is $+\Delta V$ and, if not, the second determination value is $-\Delta V$, wherein it is determined that the difference value corresponding to the difference between the first determination value and the second determination value has a value of 1, if it is compared with $-\Delta V$, that is, the reference value, and relatively large, and has a value of 0, if it is relatively small, so that when the current direction in the first semiconductor channel has the first direction and the current direction in the second semiconductor channel has the first direction, the output value has a value of 0, and when the current direction in the first semiconductor channel has the first direction and the current direction in the second semiconductor channel has the third direction, the output value has a value of 1, and when the current direction in the first semiconductor channel has the third direction and the current direction in the second semiconductor channel has the first direction, the output value has a value of 1, and when the current direction in the first semiconductor channel has the third direction and the current direction in the second semiconductor channel has the third direction, the output value has a value of 1.

The reconfigurable logic device may provide an AND logic configuration, wherein when the current direction is a first direction in the semiconductor channel, the effective magnetic field direction of the channel is a second direction, and when the current direction is a third direction opposite the first direction, the effective magnetic field direction of the channel is configured to have a fourth direction opposite the second direction, wherein a first gate voltage is applied to the first ferromagnetic gate such that the magnetization direction of the lower magnetic layer of the first ferromagnetic gate is parallel to the fourth direction, and a second gate voltage is applied to the second ferromagnetic gate such that the magnetization direction of the lower magnetic layer of the second ferromagnetic gate is parallel to the second direction, wherein when the effective magnetic field direction of the first semiconductor channel is equal to the magnetization direction of the lower magnetic layer of the first ferromagnetic gate, the first determination value is $+\Delta V$ and if not, the first determination value is $-\Delta V$, wherein when the effective magnetic field direction of the second semiconductor channel is equal to the magnetization direction of the lower magnetic layer of the second ferromagnetic gate, the second determination value is $+\Delta V$ and, if not, the second determination value is $-\Delta V$, wherein it is determined that the difference value corresponding to the difference between the first determination value and the second determination value has a value of 1, if it is compared with $+\Delta V$, that is, the reference value, and relatively large, and has a value of 0, if it is relatively small, so that when the current direction in the first semiconductor channel has the first direction and the current direction in the second semiconductor channel has the first direction, the output value has a value of 0, and when the current direction in the first semiconductor channel has the first direction and the current direction in the second semiconductor channel has the third direction, the output value has a value of 0, and when the current direction in the first semiconductor channel has the third direction and the current direction in the second semiconductor channel has the first direction, the output value has a value of 0, and when the current direction in the first semiconductor channel has the third direction and the current direction in the second semiconductor channel has the third direction, the output value has a value of 1.

The reconfigurable logic device may provide a NAND logic configuration, wherein when the current direction is a first direction in the semiconductor channel, the effective magnetic field direction of the channel is a second direction, and when the current direction is a third direction opposite the first direction, the effective magnetic field direction of the channel is configured to have a fourth direction opposite the second direction, wherein a second gate voltage is applied to the first ferromagnetic gate such that the magnetization direction of the lower magnetic layer of the first ferromagnetic gate is parallel to the second direction, and a first gate voltage is applied to the second ferromagnetic gate such that the magnetization direction of the lower magnetic layer of the second ferromagnetic gate is parallel to the fourth direction, wherein when the effective magnetic field direction of the first semiconductor channel is equal to the magnetization direction of the lower magnetic layer of the first ferromagnetic gate, the first determination value is $+\Delta V$ and if not, the first determination value is $-\Delta V$, wherein when the effective magnetic field direction of the second semiconductor channel is equal to the magnetization direction of the lower magnetic layer of the second ferromagnetic gate, the second determination value is $+\Delta V$ and, if not, the second determination value is $-\Delta V$, wherein it is determined that the difference value corresponding to the difference between the first determination value and the second determination value has a value of 1, if it is compared with $-\Delta V$, that is, the reference value, and relatively large, and has a value of 0, if it is relatively small, so that when the current direction in the first semiconductor channel has the first direction and the current direction in the second semiconductor channel has the first direction, the output value has a value of 1, and when the current direction in the first semiconductor channel has the first direction and the current direction in the second semiconductor channel has the third direction, the output value has a value of 1, and when the current direction in the first semiconductor channel has the third direction and the current direction in the second semiconductor channel has the first direction, the output value has a value of 1, and when the current direction in the first semiconductor channel has the third direction and the current direction in the second semiconductor channel has the third direction, the output value has a value of 0.

The reconfigurable logic device may provide a NOR logic configuration, wherein when the current direction is a first direction in the semiconductor channel, the effective magnetic field direction of the channel is a second direction, and when the current direction is a third direction opposite the first direction, the effective magnetic field direction of the channel is configured to have a fourth direction opposite the second direction, wherein a second gate voltage is applied to the first ferromagnetic gate such that the magnetization direction of the lower magnetic layer of the first ferromagnetic gate is parallel to the second direction, and a first gate voltage is applied to the second ferromagnetic gate such that the magnetization direction of the lower magnetic layer of the second ferromagnetic gate is parallel to the fourth direction, wherein when the effective magnetic field direction of the first semiconductor channel is equal to the magnetization direction of the lower magnetic layer of the first ferromagnetic gate, the first determination value is $+\Delta V$ and if not, the first determination value is $-\Delta V$, wherein when the effective magnetic field direction of the second semiconductor channel is equal to the magnetization direction of the lower magnetic layer of the second ferromagnetic gate, the second determination value is $+\Delta V$ and, if not, the second determination value is $-\Delta V$, wherein it is determined that the difference value corresponding to the difference between the first determination value and the second determination value has a value of 1, if it is compared with $+\Delta V$, that is, the reference value, and relatively large, and has a value of 0, if it is relatively small, so that when the current direction in the first semiconductor channel has the first direction and the current direction in the second semiconductor channel has the first direction, the output value has a value of 1, and when the current direction in the first semiconductor channel has the first direction and the current direction in the second semiconductor channel has the third direction, the output value has a value of 0, and when the current direction in the first semiconductor channel has the third direction and the current direction in the second semiconductor channel has the first direction, the output value has a value of 0, and when the current direction in the first semiconductor channel has the third direction and the current direction in the second semiconductor channel has the third direction, the output value has a value of 0.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, embodiments of the present invention are described in more detail with reference to the accompanying drawings. However, the present invention may be embodied in different forms and should not be construed as limited to the embodiments set forth herein, and rather, these embodiments are provided so that this disclosure will be thorough and complete, and will fully convey the scope of the present invention to those skilled in the art. Also, at least some of the components may be exaggerated or reduced in size for convenience of explanation. Like numbers refer to like elements throughout the drawings.

It may be interpreted that throughout the specification, when an element such as a layer or a region is referred to as being "on" another element, it may be directly "on" the other element or there may be other elements therebetween. On the other hand, when an element is referred to as being "directly on" another element, it is interpreted that there are no other elements therebetween.

Figure 1:
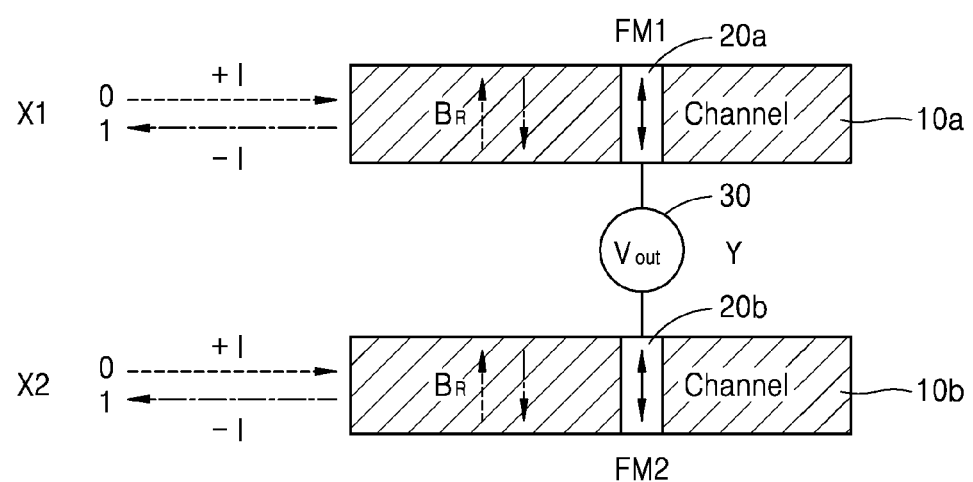
FIG. 1 is a conceptual diagram illustrating the configuration of a reconfigurable logic device using an electrochemical potential according to an embodiment of the present invention.
Figure 2:
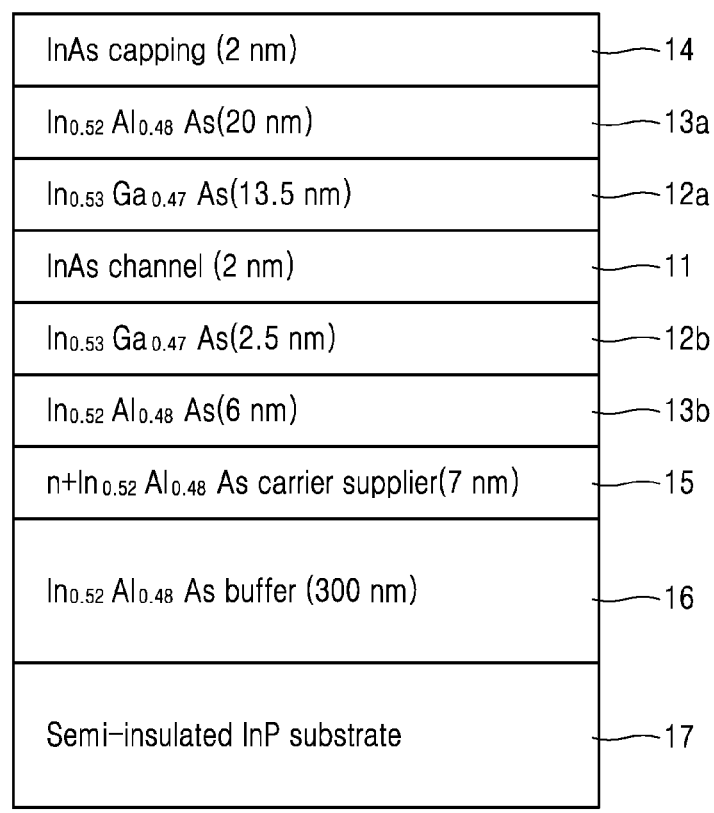
FIG. 2 is a cross-sectional view illustrating the configuration of a semiconductor channel in a reconfigurable logic device using an electrochemical potential according to an embodiment of the present invention.
Figure 3A:
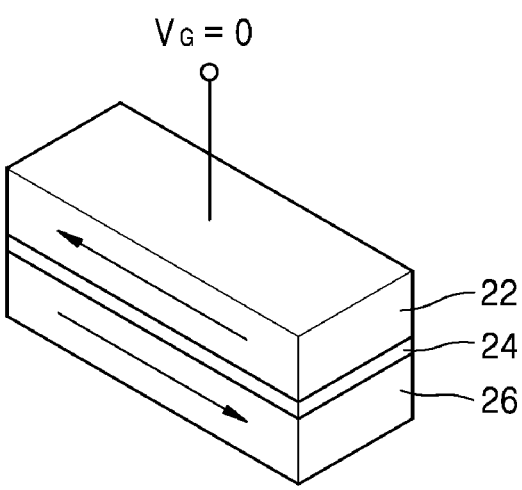
FIGS. 3A and 3B illustrate an operation concept of a ferromagnetic gate in a reconfigurable logic device using an electrochemical potential according to an embodiment of the present invention.
Figure 3B:
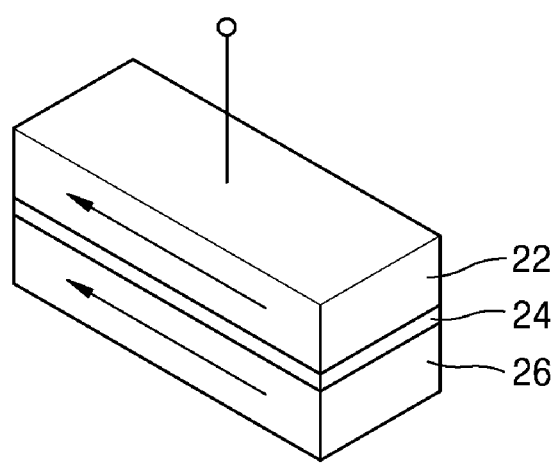

FIG. 1 is a conceptual diagram illustrating the configuration of a reconfigurable logic device using an electrochemical potential according to an embodiment of the present invention, FIG. 2 is a cross-sectional view illustrating the configuration of a semiconductor channel in a reconfigurable logic device using an electrochemical potential according to an embodiment of the present invention, and FIGS. 3A and 3B illustrate an operation concept of a ferromagnetic gate in a reconfigurable logic device using an electrochemical potential according to an embodiment of the present invention.

Referring to FIG. 1 to FIGS. 3A and 3B, a reconfigurable logic device using an electrochemical potential according to an embodiment of the present invention includes a first semiconductor channel $10a$ and a second semiconductor channel $10b$, where an effective magnetic field direction $B_R$ of a channel is controlled by a current direction and which are spaced apart from each other; and a first ferromagnetic gate $20a$ contacting the first semiconductor channel $10a$ and a second ferromagnetic gate $20b$ contacting the second semiconductor channel $10b$, where a magnetization direction is controlled by a gate voltage $V_G$.

Further, a reconfigurable logic device using an electrochemical potential according to an embodiment of the present invention includes a control unit 30 for calculating a difference value $V_{OUT}$ corresponding to a difference between a first determination value $V_{FM1}$ determined with each different value according to whether the effective magnetic field direction $B_R$ of the first semiconductor channel $10a$ is equal to the magnetization direction of the first ferromagnetic gate $20a$ and a second determination value $V_{FM2}$ determined with each different value according to whether the effective magnetic field direction $B_R$ of the second semiconductor channel $10b$ is equal to the magnetization direction of the second ferromagnetic gate $20b$, and comparing the difference value $V_{OUT}$ with a reference value $V_{ref}$ to determine an output value Y.

Referring to FIG. 1, in the first semiconductor channel $10a$ of the reconfigurable logic device using an electrochemical potential according to an embodiment of the present invention, it is configured that when the current direction is a positive direction +I, the effective magnetic field direction $B_R$ of the channel $10a$ is a positive direction (i.e., the upper direction in FIG. 1) and when the current direction is a negative direction −I, the effective magnetic field direction $B_R$ of the channel $10a$ is a negative direction (i.e., the lower part in FIG. 1). In addition, in the second semiconductor channel $10b$, it is configured that when the current direction is a positive direction +I, the effective magnetic field direction $B_R$ of the channel $10b$ is a positive direction (i.e., the upper direction in FIG. 1) and when the current direction is a negative direction −I, the effective magnetic field direction $B_R$ of the channel $10b$ is a negative direction (i.e., the lower direction in FIG. 1).

Referring to FIG. 1, when the horizontal direction is assumed to extend in the x axis and the vertical direction is assumed to extend in the y axis, the current direction +$I_x$ is defined as 0, and the current direction −$I_x$ is defined as 1. In a semiconductor channel, when the current direction is the positive direction +$I_x$, the direction of the effective magnetic field of the channel is a positive direction +$B_{Ry}$, and in a semiconductor channel, when the current direction is the negative direction −$I_x$, the effective magnetic field direction of the channel is a negative direction −$B_{Ry}$.

Referring to FIG. 2, in a reconfigurable logic device using an electrochemical potential according to an embodiment of the present invention, the semiconductor channel 10 (e.g., $10a$ or $10b$) includes a quantum well layer 11 and cladding layers $12a$ and $12b$ and $13a$ and $13b$ disposed asymmetrically above and below the quantum well layer 11, and the Rashba effect may convert an electric field into a magnetic field. The quantum well layer 11 includes at least one layer of an InAs layer, an InGaAs layer, an InSb layer, and a GaAs layer. The cladding layers $12a$, $12b$, $13a$ and $13b$ include at least one or more layers of an InGaAs layer, an InAlAs layer, an InAlSb layer, an AlGaSb layer and an AlGaAs layer.

In addition, the semiconductor channel 10 (e.g., $10a$ or $10b$) includes a topological insulator or a two-dimensional material layer in addition to a quantum well layer, and the Rashba effect may convert an electric field into a magnetic field. In a reconfigurable logic device using an electrochemical potential according to an embodiment of the present invention, a spin precession is required for a transistor operation. The basic principle for generating such a phenomenon is called a Rashba effect. The Rashba effect is a phenomenon that is central to the implementation of spin transistors in a principle of converting an electric field to a magnetic field. Assuming an arbitrary three-axis space, the basic principle is that a y-direction magnetic field is induced when electrons traveling in the x-direction receive an electric field in the z-direction. Here, the electric field may occur inside the semiconductor's heterogeneous structure and the size of the electric field may be adjusted by applying an external electric field.

The asymmetric structure shown in FIG. 2 is used as a channel in order to generate the Rashba effect inside the semiconductor and increase the electron mobility. The relative asymmetry of the layers disclosed in FIG. 2 is shown for convenience. For example, the thickness of the layers disclosed in FIG. 2 may be understood in detail by the example numerical values shown in parentheses, not the relative thicknesses shown in the drawings.

In the Rashba effect, since the asymmetry of the bonding surface plays an important role rather than the material itself, it is important to implement a sophisticated heterogeneous bonding structure. In an embodiment of the present invention, an InAs layer having a small band gap is used as a quantum well layer, and an InGaAs layer and an InAlAs layer are used as a cladding layer to confine charges in a conductive layer. Here, the asymmetric structure is formed by placing the doping layer under the quantum well layer and the reason of this is because a strong electric field may be generated according to the slope of the conduction band in the asymmetric channel and the size of the electric field may be adjusted by applying the gate voltage.

Referring to FIGS. 3A and 3B, in the reconfigurable logic device using an electrochemical potential according to an embodiment of the present invention, the ferromagnetic gate 20 (e.g., 20a or 20b) includes an upper magnetic layer 22, a lower magnetic layer 26, and an insulating layer 24 interposed between the upper magnetic layer 22 and the lower magnetic layer 26. The lower magnetic layer 26 may be arranged to contact the semiconductor channels 10a and 10b. For example, the lower magnetic layer 26 may be configured to contact the quantum well layer 11 of the semiconductor channel 20 shown in FIG. 2.

The magnetization direction of the upper magnetic layer 22 may be fixed but the magnetization direction of the lower magnetic layer 26 may be controlled by the applied gate voltage $V_G$. When the gate voltage $V_G$ is 0 V (see FIG. 3A), the magnetization direction of the upper magnetic layer 22 and the magnetization direction of the lower magnetic layer 26 may be opposite to each other. When the gate voltage $V_G$ is 1 V (see FIG. 3B), the magnetization direction of the upper magnetic layer 22 may be fixed but the magnetization direction of the lower magnetic layer 26 may be changed to be identical to the magnetization direction of the upper magnetic layer 22.

That is, in a reconfigurable logic device using an electrochemical potential according to an embodiment of the present invention, the magnetization direction of the upper magnetic layer 22 is fixed and the magnetization direction of the lower magnetic layer 26 is controlled by the gate voltage $V_G$. The lower magnetic layer 26 may contact the semiconductor channel 10 and participate in the logic operation.

In a reconfigurable logic device using an electrochemical potential according to the technical idea of the present invention described above, it is possible to perform function switching and logic functions without changing the magnetic field. Hereinafter, the principle of logic operation will be described with specific examples.

Table 1 shows the logic operation of a reconfigurable logic device using an electrochemical potential according to a first embodiment of the present invention. A reconfigurable logic device using an electrochemical potential provides an OR logic configuration.

TABLE 1

| (X1, X2) | $V_{FM1}$, $V_{FM2}$ | $V_{OUT}$ | Y |
|---|---|---|---|
| (0, 0) | −ΔV, +ΔV | −2ΔV | 0 |
| (0, 1) | −ΔV, −ΔV | 0 | 1 |
| (1, 0) | +ΔV, +ΔV | 0 | 1 |
| (1, 1) | +ΔV, −ΔV | +2ΔV | 1 |

Referring to Table 1, in a reconfigurable logic device using an electrochemical potential to provide an OR logic configuration, when the input value is (0,0), the effective magnetic field direction of the channel is determined as $+B_{Ry}$ since the current directions of X1 and X2 are all $+I_x$. In the case of an OR gate, since the magnetization directions of the first ferromagnetic gate FM1 and the second ferromagnetic gate FM2 that are already set are $-M_y$ and $+M_y$, the magnetization direction of the lower magnetic layer of the first ferromagnetic gate and the effective magnetic field direction of the first semiconductor channel are anti-parallel and have a −ΔV value, and the magnetization direction of the lower magnetic layer of the second ferromagnetic gate and the effective magnetic field direction of the second semiconductor channel are parallel and have a +ΔV value, and since it is determined that $V_{OUT}=V_{FM1}-V_{FM2}=(-\Delta V)-(+\Delta V)=-2\Delta V$ and it is less than $V_{ref}=-\Delta V$, the output value is determined as 0.

In a reconfigurable logic device using an electrochemical potential, which applies the principle of such a logic operation overall, as a logic device that provides an OR logic configuration, when the current direction is a positive direction in the semiconductor channels 10a and 10b, the effective magnetic field direction BR of the channel is a positive direction, and when the current direction is a negative direction, the effective magnetic field direction $B_R$ of the channel is configured to have a negative direction, and when the gate voltage $V_G$ is applied to the first ferromagnetic gate 20a, the magnetization direction of the first ferromagnetic gate 20a is a negative direction, and when the gate voltage $V_G$ is applied to the second ferromagnetic gate 20b, the magnetization direction of the second ferromagnetic gate 20b is configured to have a positive direction, and when the effective magnetic field direction $B_R$ of the first semiconductor channel 10a is equal to the magnetization direction of the first ferromagnetic gate 20a, the first determination value $V_{FM1}$ is +ΔV and if not, the first determination value $V_{FM1}$ is −ΔV, and when the effective magnetic field direction $B_R$ of the second semiconductor channel 10b is equal to the magnetization direction of the second ferromagnetic gate 20b, the second determination value $V_{FM2}$ is +ΔV and, if not, the second determination value $V_{FM2}$ is −ΔV, and it is determined that the difference value $V_{OUT}$ corresponding to the difference between the first determination value $V_{FM1}$ and the second determination value $V_{FM2}$ has a value of 1, if it is compared with −ΔV, that is, the reference value $V_{ref}$, and relatively large, and has a value of 0, if it is relatively small, so that when the current direction in the first semiconductor channel 10a has a positive direction and the current direction in the second semiconductor channel 10b has a positive direction, the output value has a value of 0, and when the current direction in the first semiconductor channel 10a has a positive direction and the current direction in the second semiconductor channel 10b has a negative direction, the output value has a value of 1, and when the current direction in the first semiconductor channel 10a has a negative direction and the current direction in the second semiconductor channel 10b has a positive direction, the output value has a value of 1, and when the current direction in the first semiconductor channel 10a has a negative direction and the current direction in the second semiconductor channel 10b has a negative direction, the output value has a value of 1.

Table 2 shows the logic operation of a reconfigurable logic device using an electrochemical potential according to a second embodiment of the present invention. A reconfigurable logic device using an electrochemical potential provides an AND logic configuration.

TABLE 2

| (X1, X2) | $V_{FM1}$, $V_{FM2}$ | $V_{OUT}$ | Y |
|---|---|---|---|
| (0, 0) | $-\Delta V$, $+\Delta V$ | $-2\Delta V$ | 0 |
| (0, 1) | $-\Delta V$, $-\Delta V$ | 0 | 0 |
| (1, 0) | $+\Delta V$, $+\Delta V$ | 0 | 0 |
| (1, 1) | $+\Delta V$, $-\Delta V$ | $+2\Delta V$ | 1 |

Referring to Table 2, in a reconfigurable logic device using an electrochemical potential to provide an AND logic configuration, when the input value is (0.1), the effective magnetic field direction of the channel is determined as $+B_{Ry}$ and $-B_{Ry}$ since the current directions of X1 and X2 are $+I_x$ and $-I_x$, respectively. In the case of an AND gate, since the magnetization directions of the first ferromagnetic gate FM1 and the second ferromagnetic gate FM2 that are already set are $-M_y$ and $+M_y$, the magnetization direction of the lower magnetic layer of the first ferromagnetic gate and the effective magnetic field direction of the first semiconductor channel are parallel and have a $+\Delta V$ value, and the magnetization direction of the lower magnetic layer of the second ferromagnetic gate and the effective magnetic field direction of the second semiconductor channel are parallel and have a $+\Delta V$ value, and since it is determined that $V_{OUT}=V_{FM1}-V_{FM2}=(+\Delta V)-(+\Delta V)=0$ and it is less than $V_{ref}=+\Delta V$, the output value is determined as 0.

In a reconfigurable logic device using an electrochemical potential, which applies the principle of such a logic operation overall, as a logic device that provides an AND logic configuration, when the current direction is a positive direction in the semiconductor channels 10a and 10b, the effective magnetic field direction $B_R$ of the channel is a positive direction, and when the current direction is a negative direction, the effective magnetic field direction $B_R$ of the channel is configured to have a negative direction, and when the gate voltage $V_G$ is applied to the first ferromagnetic gate 20a, the magnetization direction of the first ferromagnetic gate 20a is a negative direction, and when the gate voltage $V_G$ is applied to the second ferromagnetic gate 20b, the magnetization direction of the second ferromagnetic gate 20b is configured to have a positive direction, and when the effective magnetic field direction $B_R$ of the first semiconductor channel 10a is equal to the magnetization direction of the first ferromagnetic gate 20a, the first determination value $V_{FM1}$ is $+\Delta V$ and if not, the first determination value $V_{FM1}$ is $-\Delta V$, and when the effective magnetic field direction $B_R$ of the second semiconductor channel 10b is equal to the magnetization direction of the second ferromagnetic gate 20b, the second determination value $V_{FM2}$ is $+\Delta V$ and, if not, the second determination value $V_{FM2}$ is $-\Delta V$, and it is determined that the difference value $V_{OUT}$ corresponding to the difference between the first determination value $V_{FM1}$ and the second determination value $V_{FM2}$ has a value of 1, if it is compared with $+\Delta V$, that is, the reference value $V_{ref}$, and relatively large, and has a value of 0, if it is relatively small, so that when the current direction in the first semiconductor channel 10a has a positive direction and the current direction in the second semiconductor channel 10b has a positive direction, the output value has a value of 0, and when the current direction in the first semiconductor channel 10a has a positive direction and the current direction in the second semiconductor channel 10b has a negative direction, the output value has a value of 0, and when the current direction in the first semiconductor channel 10a has a negative direction and the current direction in the second semiconductor channel 10b has a positive direction, the output value has a value of 0, and when the current direction in the first semiconductor channel 10a has a negative direction and the current direction in the second semiconductor channel 10b has a negative direction, the output value has a value of 1.

Table 3 shows the logic operation of a reconfigurable logic device using an electrochemical potential according to a third embodiment of the present invention. A reconfigurable logic device using an electrochemical potential provides a NAND logic configuration.

TABLE 3

| (X1, X2) | $V_{FM1}$, $V_{FM2}$ | $V_{OUT}$ | Y |
|---|---|---|---|
| (0, 0) | $+\Delta V$, $-\Delta V$ | $+2\Delta V$ | 1 |
| (0, 1) | $+\Delta V$, $+\Delta V$ | 0 | 1 |
| (1, 0) | $-\Delta V$, $-\Delta V$ | 0 | 1 |
| (1, 1) | $-\Delta V$, $+\Delta V$ | $-2\Delta V$ | 0 |

Referring to Table 3, in a reconfigurable logic device using an electrochemical potential to provide a NAND logic configuration, when the input value is (0,0), the effective magnetic field direction of the channel is determined as $+B_{Ry}$ since the current directions of X1 and X2 are all $+I_x$. In the case of a NAND gate, since the magnetization directions of the first ferromagnetic gate FM1 and the second ferromagnetic gate FM2 that are already set are $+M_y$ and $-M_y$, the magnetization direction of the lower magnetic layer of the first ferromagnetic gate and the effective magnetic field direction of the first semiconductor channel are parallel and have a $+\Delta V$ value, and the magnetization direction of the lower magnetic layer of the second ferromagnetic gate and the effective magnetic field direction of the second semiconductor channel are anti-parallel and have a $-\Delta V$ value, and since it is determined that $V_{OUT}=V_{FM1}-V_{FM2}=(+\Delta V)-(-\Delta V)=+2\Delta V$ and it is greater than $V_{ref}=-\Delta V$, the output value is determined as 1.

In a reconfigurable logic device using an electrochemical potential, which applies the principle of such a logic operation overall, as a logic device that provides a NAND logic configuration, when the current direction is a positive direction in the semiconductor channels 10a and 10b, the effective magnetic field direction $B_R$ of the channel is a positive direction, and when the current direction is a negative direction, the effective magnetic field direction $B_R$ of the channel is configured to have a negative direction, and when the gate voltage $V_G$ is applied to the first ferromagnetic gate 20a, the magnetization direction of the first ferromagnetic gate 20a is a positive direction, and when the gate voltage $V_G$ is applied to the second ferromagnetic gate 20b, the magnetization direction of the second ferromagnetic gate 20b is configured to have a negative direction, and when the effective magnetic field direction $B_R$ of the first semiconductor channel 10a is equal to the magnetization direction of the first ferromagnetic gate 20a, the first determination value $V_{FM1}$ is $+\Delta V$ and if not, the first determination value $V_{FM1}$ is $-\Delta V$, and when the effective magnetic field direction $B_R$ of the second semiconductor channel 10b is equal to the magnetization direction of the second ferromagnetic gate 20b, the second determination value $V_{FM2}$ is $+\Delta V$ and, if not, the second determination value $V_{FM2}$ is $-\Delta V$, and it is determined that the difference value $V_{OUT}$ corresponding to the difference between the first determination value $V_{FM1}$ and the second determination value $V_{FM2}$ has a value of 1, if it is compared with $-\Delta V$, that is, the reference value $V_{ref}$, and relatively large, and has a value of 0, if it is relatively small, so that when the current direction in the first semiconductor channel 10a has a positive direction and the current direction in the second semiconductor channel 10b has a positive direction, the output value has a value of 1, and when the current direction in the first semiconductor channel 10a has a positive direction and the current direction in the second semiconductor channel 10b has a negative direction, the output value has a value of 1, and when the current direction in the first semiconductor channel 10a has a negative direction and the current direction in the second semiconductor channel 10b has a positive direction, the output value has a value of 1, and when the current direction in the first semiconductor channel 10a has a negative direction and the current direction in the second semiconductor channel 10b has a negative direction, the output value has a value of 0.

Table 4 shows the logic operation of a reconfigurable logic device using an electrochemical potential according to a fourth embodiment of the present invention. A reconfigurable logic device using an electrochemical potential provides a NOR logic configuration.

TABLE 4

| (X1, X2) | $V_{FM1}$, $V_{FM2}$ | $V_{OUT}$ | Y |
|---|---|---|---|
| (0, 0) | +ΔV, −ΔV | +2ΔV | 1 |
| (0, 1) | +ΔV, +ΔV | 0 | 0 |
| (1, 0) | −ΔV, −ΔV | 0 | 0 |
| (1, 1) | −ΔV, +ΔV | −2ΔV | 0 |

Referring to Table 4, in a reconfigurable logic device using an electrochemical potential to provide a NOR logic configuration, when the input value is (1.1), the effective magnetic field direction of the channel is determined as $-B_{Ry}$, since the current directions of X1 and X2 are all $-I_x$. In the case of a NOR gate, since the magnetization directions of the first ferromagnetic gate FM1 and the second ferromagnetic gate FM2 that are already set are $+M_y$ and $-M_y$, the magnetization direction of the lower magnetic layer of the first ferromagnetic gate and the effective magnetic field direction of the first semiconductor channel are anti-parallel and have a −ΔV value, and the magnetization direction of the lower magnetic layer of the second ferromagnetic gate and the effective magnetic field direction of the second semiconductor channel are parallel and have a +ΔV value, and since it is determined that $V_{OUT}=V_{FM1}-V_{FM2}=(-\Delta V)-(+\Delta V)=-2\Delta V$ and it is less than $V_{ref}=-\Delta V$, the output value is determined as 0.

In a reconfigurable logic device using an electrochemical potential, which applies the principle of such a logic operation overall, as a logic device that provides a NOR logic configuration, when the current direction is a positive direction in the semiconductor channels 10a and 10b, the effective magnetic field direction $B_R$ of the channel is a positive direction, and when the current direction is a negative direction, the effective magnetic field direction $B_R$ of the channel is configured to have a negative direction, and when the gate voltage $V_G$ is applied to the first ferromagnetic gate 20a, the magnetization direction of the first ferromagnetic gate 20a is a positive direction, and when the gate voltage $V_G$ is applied to the second ferromagnetic gate 20b, the magnetization direction of the second ferromagnetic gate 20b is configured to have a negative direction, and when the effective magnetic field direction $B_R$ of the first semiconductor channel 10a is equal to the magnetization direction of the first ferromagnetic gate 20a, the first determination value $V_{FM1}$ is +ΔV and if not, the first determination value $V_{FM1}$ is −ΔV, and when the effective magnetic field direction $B_R$ of the second semiconductor channel 10b is equal to the magnetization direction of the second ferromagnetic gate 20b, the second determination value $V_{FM2}$ is +ΔV and, if not, the second determination value $V_{FM2}$ is −ΔV, and it is determined that the difference value $V_{OUT}$ corresponding to the difference between the first determination value $V_{FM1}$ and the second determination value $V_{FM2}$ has a value of 1, if it is compared with +ΔV, that is, the reference value $V_{ref}$, and relatively large, and has a value of 0, if it is relatively small, so that when the current direction in the first semiconductor channel 10a has a positive direction and the current direction in the second semiconductor channel 10b has a positive direction, the output value has a value of 1, and when the current direction in the first semiconductor channel 10a has a positive direction and the current direction in the second semiconductor channel 10b has a negative direction, the output value has a value of 0, and when the current direction in the first semiconductor channel 10a has a negative direction and the current direction in the second semiconductor channel 10b has a positive direction, the output value has a value of 0, and when the current direction in the first semiconductor channel 10a has a negative direction and the current direction in the second semiconductor channel 10b has a negative direction, the output value has a value of 0.

Semiconductor-based logic devices are the most important and high value-added field in integrated circuits that perform and process complex functions, and research groups and companies are conducting research thereon. The logic devices are a core field for carrying out various operations, and are a key field that leads the semiconductor market together with the memory elements. In the recent logic device, since the silicon electronic element technology approaches the physical limit, it is difficult to reduce the size of the element and the nano-sized element process is consuming a lot of cost. As a result, the emergence of next generation electronic elements has become necessary. For example, research has been conducted on electronic elements using the concept of using spin, which is a quantum mechanical property of electrons, rather than simply improving or miniaturizing existing elements. The logic device using existing spintronics mainly generates a large number of spin currents to use the superposition of such currents and uses spin memory as a secondary, and the actual logic function is mostly done by conventional CMOS. The above-described invention is a revolutionary invention in which moving away from such an approach, charges are converted directly to spin, and in addition to converting a plurality of input values to a voltage output using a ferromagnetic material, the magnetization direction of the ferromagnetic material is changed to reset a logic function.

According to embodiments of the present invention, provided is a logic device capable of fundamentally overcoming the physical limitations of silicon electronic element technology, and provided is a reconfigurable logic device using an electrochemical potential. Of course, the scope of the present invention is not limited by such an effect.

Although the reconfigurable logic device using an electrochemical potential has been described with reference to the specific embodiments, it is not limited thereto. Therefore, it will be readily understood by those skilled in the art that various modifications and changes can be made thereto without departing from the spirit and scope of the present invention defined by the appended claims.

What is claimed is:

1. A reconfigurable logic device using an electrochemical potential, the reconfigurable logic device comprising:

a first semiconductor channel and a second semiconductor channel spaced apart from each other and configured to receive a current in either of directions along a length of the first semiconductor channel and the second semiconductor channel, wherein the first semiconductor channel and the second semiconductor channel are configured such that a direction of an effective magnetic field of each of the first semiconductor channel and the second semiconductor channel is controlled by a direction of the current received by each of the first semiconductor channel and the second semiconductor channel;

a first ferromagnetic gate contacting the first semiconductor channel and a second ferromagnetic gate contacting the second semiconductor channel, configured such that a magnetization direction of the first ferromagnetic gate and a magnetization direction of the second ferromagnetic gate are controlled by a gate voltage; and a control unit configured to calculate a difference value corresponding to a difference between a first determination value determined according to whether the direction of the effective magnetic field of the first semiconductor channel is equal to the magnetization direction of the first ferromagnetic gate and a second determination value determined according to whether the direction of the effective magnetic field of the second semiconductor channel is equal to the magnetization direction of the second ferromagnetic gate, and compare the difference value with a reference value to determine an output value, wherein at least one of the first ferromagnetic gate or the second ferromagnetic gate comprises an upper magnetic layer, a lower magnetic layer, and an insulating layer interposed between the upper magnetic layer and the lower magnetic layer, wherein a magnetization direction of the upper magnetic layer is fixed but a magnetization direction of the lower magnetic layer is controlled by the gate voltage such that the magnetization direction of the lower magnetic layer determines a logic function, and wherein the lower magnetic layer is disposed to contact a corresponding one of the first semiconductor channel or the second semiconductor channel.

2. The reconfigurable logic device of claim 1, wherein at least one of the first semiconductor channel or the second semiconductor channel comprises a quantum well layer and a cladding layer disposed asymmetrically above and below the quantum well layer, or comprises a topological insulator or a two-dimensional material layer such that an electric field is generated in the at least one of the first semiconductor channel or the second semiconductor channel, wherein an effective magnetic field is induced by the current in a presence of the electric field via the Rashba effect.

3. The reconfigurable logic device of claim 2, wherein the quantum well layer comprises at least one of an InAs layer, an InGaAs layer, an InSb layer, and a GaAs layer and the cladding layer comprises at least one or more of an InGaAs layer, an InAlAs layer, an InAlSb layer, an AlGaSb layer and an AlGaAs layer.

4. The reconfigurable logic device of claim 1, which provides an OR logic configuration, wherein when the current direction is a first direction in at least one of the first semiconductor channel or the second semiconductor channel, the direction of the effective magnetic field of at least one of the first semiconductor channel or the second semiconductor channel is a second direction, and when the current direction is a third direction opposite the first direction, the direction of the effective magnetic field of at least one of the first semiconductor channel or the second semiconductor channel is configured to have a fourth direction opposite the second direction, wherein a first gate voltage is applied to the first ferromagnetic gate such that the magnetization direction of the lower magnetic layer of the first ferromagnetic gate is parallel to the fourth direction, and a second gate voltage is applied to the second ferromagnetic gate such that the magnetization direction of the lower magnetic layer of the second ferromagnetic gate is parallel to the second direction, wherein when the direction of the effective magnetic field of the first semiconductor channel is equal to the magnetization direction of the lower magnetic layer of the first ferromagnetic gate, the first determination value is $+\Delta V$ and if not, the first determination value is $-\Delta V$, wherein when the direction of the effective magnetic field of the second semiconductor channel is equal to the magnetization direction of the lower magnetic layer of the second ferromagnetic gate, the second determination value is $+\Delta V$ and if not, the second determination value is $-\Delta V$, wherein it is determined that the difference value corresponding to the difference between the first determination value and the second determination value has a value of 1, if it is larger than $-\Delta V$, and has a value of 0, if it is smaller than $-\Delta V$, so that when the current direction in the first semiconductor channel has the first direction and the current direction in the second semiconductor channel has the first direction, the output value has a value of 0, and when the current direction in the first semiconductor channel has the first direction and the current direction in the second semiconductor channel has the third direction, the output value has a value of 1, and when the current direction in the first semiconductor channel has the third direction and the current direction in the second semiconductor channel has the first direction, the output value has a value of 1, and when the current direction in the first semiconductor channel has the third direction and the current direction in the second semiconductor channel has the third direction, the output value has a value of 1.

5. The reconfigurable logic device of claim 1, which provides an AND logic configuration, wherein when the current direction is a first direction in at least one of the first semiconductor channel or the second semiconductor channel, the direction of the effective magnetic field of at least one of the first semiconductor channel or the second semiconductor channel is a second direction, and when the current direction is a third direction opposite the first direction, the direction of the effective magnetic field of at least one of the first semiconductor channel or the second semiconductor channel is configured to have a fourth direction opposite the second direction, wherein a first gate voltage is applied to the first ferromagnetic gate such that the magnetization direction of the lower magnetic layer of the first ferromagnetic gate is parallel to the fourth direction, and a second gate voltage is applied to the second ferromagnetic gate such that the magnetization direction of the lower magnetic layer of the second ferromagnetic gate is parallel to the second direction, wherein when the direction of the effective magnetic field of the first semiconductor channel is equal to the magnetization direction of the lower magnetic layer of the first ferromagnetic gate, the first determination value is +ΔV and if not, the first determination value is −ΔV, wherein when the direction of the effective magnetic field of the second semiconductor channel is equal to the magnetization direction of the lower magnetic layer of the second ferromagnetic gate, the second determination value is +ΔV and if not, the second determination value is −ΔV, wherein it is determined that the difference value corresponding to the difference between the first determination value and the second determination value has a value of 1, if it is larger than +ΔV, and has a value of 0, if it is smaller than +ΔV, so that when the current direction in the first semiconductor channel has the first direction and the current direction in the second semiconductor channel has the first direction, the output value has a value of 0, and when the current direction in the first semiconductor channel has the first direction and the current direction in the second semiconductor channel has the third direction, the output value has a value of 0, and when the current direction in the first semiconductor channel has the third direction and the current direction in the second semiconductor channel has the first direction, the output value has a value of 0, and when the current direction in the first semiconductor channel has the third direction and the current direction in the second semiconductor channel has the third direction, the output value has a value of 1.

6. The reconfigurable logic device of claim 1, which provides a NAND logic configuration, wherein when the current direction is a first direction in at least one of the first semiconductor channel or the second semiconductor channel, the direction of the effective magnetic field of at least one of the first semiconductor channel or the second semiconductor channel is a second direction, and when the current direction is a third direction opposite the first direction, the direction of the effective magnetic field of at least one of the first semiconductor channel or the second semiconductor channel is configured to have a fourth direction opposite the second direction, wherein a second gate voltage is applied to the first ferromagnetic gate such that the magnetization direction of the lower magnetic layer of the first ferromagnetic gate is parallel to the second direction, and a first gate voltage is applied to the second ferromagnetic gate such that the magnetization direction of the lower magnetic layer of the second ferromagnetic gate is parallel to the fourth direction, wherein when the direction of the effective magnetic field of the first semiconductor channel is equal to the magnetization direction of the lower magnetic layer of the first ferromagnetic gate, the first determination value is +ΔV and if not, the first determination value is −ΔV, wherein when the direction of the effective magnetic field of the second semiconductor channel is equal to the magnetization direction of the lower magnetic layer of the second ferromagnetic gate, the second determination value is +ΔV and if not, the second determination value is −ΔV, wherein it is determined that the difference value corresponding to the difference between the first determination value and the second determination value has a value of 1, if it is larger than −ΔV, and has a value of 0, if it is smaller than −ΔV, so that when the current direction in the first semiconductor channel has the first direction and the current direction in the second semiconductor channel has the first direction, the output value has a value of 1, and when the current direction in the first semiconductor channel has the first direction and the current direction in the second semiconductor channel has the third direction, the output value has a value of 1, and when the current direction in the first semiconductor channel has the third direction and the current direction in the second semiconductor channel has the first direction, the output value has a value of 1, and when the current direction in the first semiconductor channel has the third direction and the current direction in the second semiconductor channel has the third direction, the output value has a value of 0.

7. The reconfigurable logic device of claim 1, which provides a NOR logic configuration, wherein when the current direction is a first direction in at least one of the first semiconductor channel or the second semiconductor channel, the direction of the effective magnetic field of at least one of the first semiconductor channel or the second semiconductor channel is a second direction, and when the current direction is a third direction opposite the first direction, the direction of the effective magnetic field of at least one of the first semiconductor channel or the second semiconductor channel is configured to have a fourth direction opposite the second direction, wherein a second gate voltage is applied to the first ferromagnetic gate such that the magnetization direction of the lower magnetic layer of the first ferromagnetic gate is parallel to the second direction, and a first gate voltage is applied to the second ferromagnetic gate such that the magnetization direction of the lower magnetic layer of the second ferromagnetic gate is parallel to the fourth direction, wherein when the direction of the effective magnetic field of the first semiconductor channel is equal to the magnetization direction of the lower magnetic layer of the first ferromagnetic gate, the first determination value is +ΔV and if not, the first determination value is −ΔV, wherein when the direction of the effective magnetic field of the second semiconductor channel is equal to the magnetization direction of the lower magnetic layer of the second ferromagnetic gate, the second determination value is +ΔV and if not, the second determination value is −ΔV, wherein it is determined that the difference value corresponding to the difference between the first determination value and the second determination value has a value of 1, if it is larger than +ΔV, and has a value of 0, if it is smaller than +ΔV, so that when the current direction in the first semiconductor channel has the first direction and the current direction in the second semiconductor channel has the first direction, the output value has a value of 1, and when the current direction in the first semiconductor channel has the first direction and the current direction in the second semiconductor channel has the third direction, the output value has a value of 0, and when the current direction in the first semiconductor channel has the third direction and the current direction in the second semiconductor channel has the first direction, the output value has a value of 0, and when the current direction in the first semiconductor channel has the third direction and the current direction in the second semiconductor channel has the third direction, the output value has a value of 0.

\* \* \* \* \*